United States Patent
Lee

(10) Patent No.: US 6,961,275 B2
(45) Date of Patent: Nov. 1, 2005

(54) DEVICE AND METHOD FOR BREAKING LEAKAGE CURRENT PATH OF MEMORY DEVICE AND STRUCTURE OF MEMORY DEVICE

(75) Inventor: Cheng-Sheng Lee, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 61 days.

(21) Appl. No.: 10/707,866

(22) Filed: Jan. 20, 2004

(65) Prior Publication Data

US 2005/0088891 A1 Apr. 28, 2005

(30) Foreign Application Priority Data

Oct. 22, 2003 (TW) .......................................... 92129227 A

(51) Int. Cl.⁷ ................................................. G11C 7/00
(52) U.S. Cl. ........................ 365/203; 365/200; 365/205
(58) Field of Search ................................ 365/203, 200, 365/205, 204

(56) References Cited

U.S. PATENT DOCUMENTS 6,097,652 A * 8/2000 Roh ............................. 365/205

* cited by examiner

*Primary Examiner*—David Lam
(74) *Attorney, Agent, or Firm*—Jianq Chyun IP Office

(57) ABSTRACT

A device and a method for breaking leakage current path caused by a defect in a memory cell of a memory array are disclosed. The device includes a first breaking circuit and a second breaking circuit. When at least one memory cell is failed, the first breaking circuit can disconnect the connection between the bit line and the power supplying terminal and the connection between the bit line bar and the power supplying terminal. Moreover, the second breaking circuit can disconnect the connection between the bit line and the sense amplifier and the connection between bit line bar and the sense amplifier. Accordingly, the leakage current from the power supplying terminal to the defective memory cell can be eliminated.

12 Claims, 7 Drawing Sheets

DEVICE AND METHOD FOR BREAKING LEAKAGE CURRENT PATH OF MEMORY DEVICE AND STRUCTURE OF MEMORY DEVICE

CROSS REFERENCE TO RELATED APPLICATIONS

This application claims the priority benefit of Taiwan application serial no. 92129227, filed on Oct. 22, 2003.

BACKGROUND OF INVENTION

1. Field of the Invention

The present invention relates to a device and a method of breaking leakage current path of a memory device and a structure of the memory device.

2. Description of the Related Art

Traditionally, the semiconductor memory may be classified into a non-volatile memory and a volatile memory.

The non-volatile memory can still retain the data even when the power is off. In contrast, in the volatile memory, such as static random access memory (SRAM) and dynamic random access memory (DRAM), the data is lost when the power is off.

As to the volatile memory, because SRAM is constructed by transistors, the speed of SRAM is about five times faster than the speed of DRAM. However, the cost and size of SRAM are respectively higher and larger than that of the DRAM. Therefore, in considerations of cost and size, DRAM is most widely used volatile memory. DRAM uses capacitors for storing data. Because of charge leakage from the capacitors, a refresh operation is required for recharging the capacitors. Therefore, if the power is turned off, the data stored therein will be lost. Even when the power is normally supplied, the data will gradually disappear because of the charge leakage of the capacitors. Therefore, the refresh operation is required.

Basically, a memory cell of DRAM comprises a transistor and a capacitor. Referring to FIG. 1, a schematic drawing a memory cell of DRAM is shown, wherein the capacitor is provided for storing charges to determine whether a logic state "1" or "0" is stored therein. Since the integration and density of DRAM cells are increased gradually, the defects occuring from the manufacturing process of the DRAM cells or due to the shorting between the cells can behardly prevented. Referring to FIG. 1, a traditional DRAM array includes memory cells 102 and 104 and a sense amplifier 106, wherein when a short of the bit line BLL and word line WLL of the memory cell 102 occurs at point A, a leakage current F is resulted. That is, the leakage current F will result in current leakage from the power supplying terminal VBLEQ via the bit line BLL of the memory cell 102 to the ground of the capacitor. When the memory is in standby state, the leakage current consumes a lot of power. Therefore, the longer the standby state, the more the consumption of power is.

Generally, in order to maintain a high signal-to-noise ratio (S/N ration), the leakage current can not be reduced by reducing the capacitance of the capacitor. The leakage current, in general, is about 300 $\mu$A for each current leakage path. Therefore, a conventional method to resolve the issue was proposed. FIG. 2 is a schematic drawing illustrating another conventional memory cell of DRAM. Referring to FIG. 2, a current limiting device, such as a depletion type NMOS transistor with low threshold voltage, is connected to the bit line pre-charger circuit of the memory cell 102 for reducing the leakage current. By using the current limiting device, the leakage current can be reduced up to about 15 $\mu$A for each current leakage path.

However, the disadvantage of the current limiting device is that even when the defective memory cell is replaced by a redundancy memory cell, the leakage current still exists and the period of pre-charging will be extended. More seriously, the leakage current is proportional to the number of the defective cells. For the portable electronic devices, the leakage current will drastically reduce the time of standby state of the battery, resulting in reduction of the speed of the memory and increase of the temperature of the device. Therefore, a device and a method for breaking current leakage path are highly desirable.

SUMMARY OF INVENTION

Therefore, one object of the present invention is to provide a device and a method for breaking leakage current path and a memory device for reducing leakage current to resolve the issues of high power consumption and rising temperature resulting from the current leakage in a traditional DRAM.

In order to achieve the above objects and other advantages of the present invention, a device for breaking leakage current path of a memory cell of a memory device is provided. The device includes a memory cell, a first breaking circuit and a second breaking circuit. The memory cell of a memory array has a first bit line and a second bit line. The first breaking circuit is connected between the first bit line of the memory cell and a power supplying terminal, and between the second bit line and the power supplying terminal. When the memory cell fails and in standby state, the first bit line and the power supplying terminal are disconnected, and the second bit line and the power supplying terminal are disconnected by the first breaking circuit. The second breaking circuit is connected between the first bit line and a sense amplifier of the memory cell, and between the second bit line and the sense amplifier. When the memory cell fails and in standby state, the first bit line and the sense amplifier are disconnected and the second bit line and the sense amplifier are disconnected by the second breaking circuit.

In an embodiment of the present invention, a word line of the memory cell can be connected to the first breaking circuit or to the second breaking circuit.

In an embodiment of the invention, the second breaking circuit can be included in the first breaking circuit.

In order to achieve the other objects of the present invention, a memory device is provided. The memory device includes, for example but not limited to, a memory array, a power supplying terminal, a sense amplifier, a first breaking circuit and a second breaking circuit. The memory array has a plurality of memory cells, wherein each of the memory cells has a first bit line and a second bit line. The power supplying terminal is used to provide power to the memory cells. The first breaking circuit is connected between the first bit line of the memory cell and a power supplying terminal, and between the second bit line and the power supplying terminal. When the memory cell fails and in standby state, the first bit line and the power supplying terminal are disconnected, and the second bit line and the power supplying terminal are disconnected by the first breaking circuit. The second breaking circuit is connected between the first bit line and a sense amplifier of the memory cell, and between the second bit line and the sense amplifier. When the memory cell fails and in standby state, the first bit line and the sense amplifier are disconnected and the second bit line and the sense amplifier are disconnected by the second breaking circuit.

In an embodiment of the invention, word lines of the memory cells can be connected to the first breaking circuit or to the second breaking circuit.

In an embodiment of the invention, the second breaking circuit can be included in the first breaking circuit.

In an embodiment of the invention, the memory array includes a DRAM array.

Accordingly, the first breaking circuit and the second breaking circuit of the present invention can break the leakage current from the power supplying terminal applied to the memory cell when the memory cell fails. Moreover, when the memory array is in standby state, the current paths from the power source to all the failed memory cells are broken, therefore, the leakage current is substantially reduced and the power consumption is also reduced.

In order to achieve the other object of the present invention, a method for breaking leakage current path of a memory cell of a memory device is provided. The method includes the steps of providing a first signal for disconnecting a connection between a first bit line and a power supplying terminal and for disconnecting a connection between a second bit line and the power supplying terminal when a memory cell of a memory array fails and in standby state; and providing a second signal for disconnecting a connection between the first bit line and a sense amplifier and for disconnecting a connection between the second bit line and the sense amplifier.

In an embodiment of the present invention, the first signal can be controlled by a word line of the memory cell. Moreover, the second signal can also be controlled by the word line of the memory cell.

Accordingly, the method for breaking leakage current path of the present invention can break the leakage current from the power supplying terminal applied to the memory cell when the memory cell fails. Moreover, when the memory array is in standby state, the current paths from the power source to all the failed memory cells are broken, therefore, the leakage current are reduced and the power consumption is also reduced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
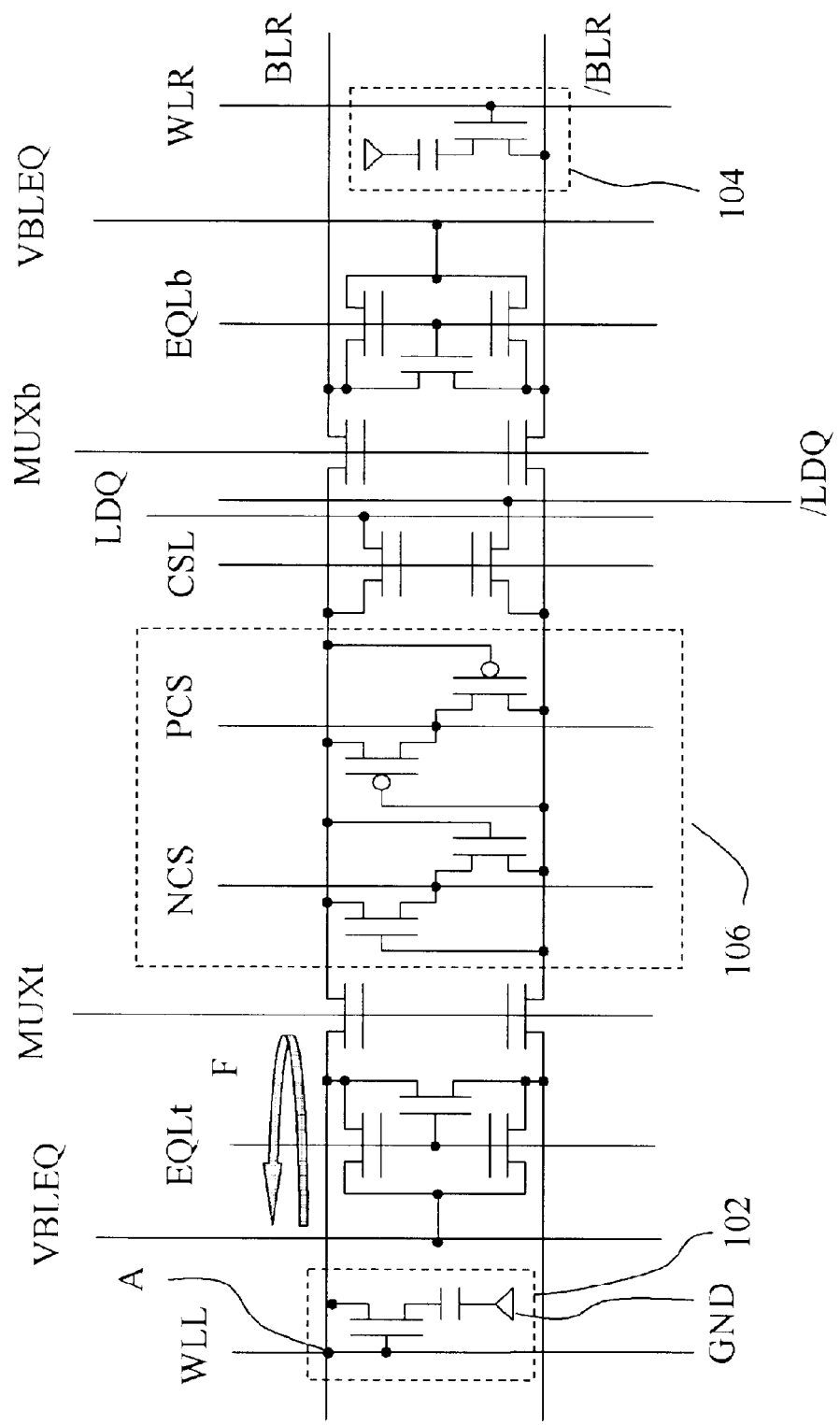
FIG. 1 is a schematic drawing illustrating a conventional memory cell of DRAM.
Figure 2:
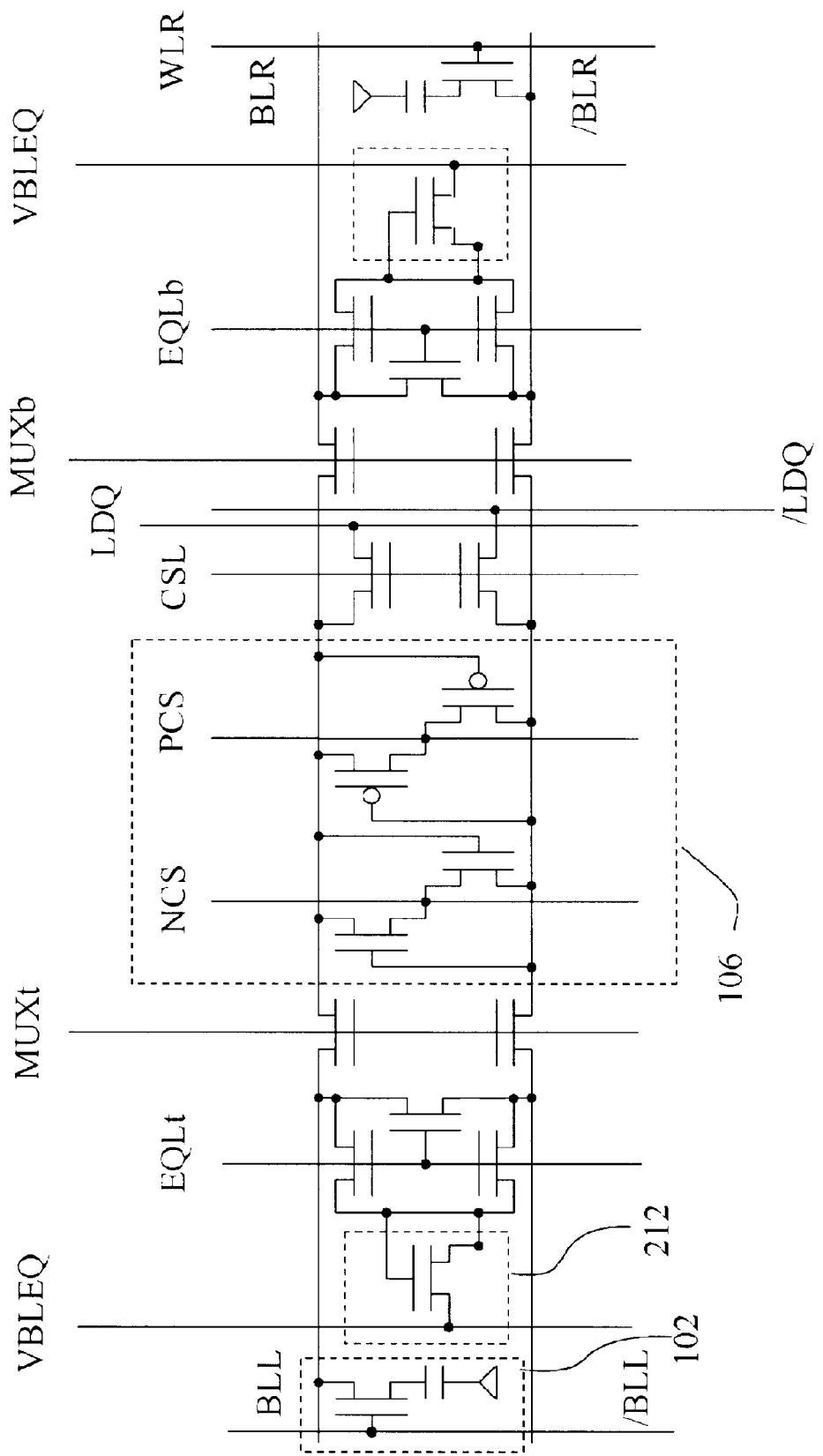
FIG. 2 is a schematic drawing illustrating another conventional memory cell of DRAM.
Figure 3:
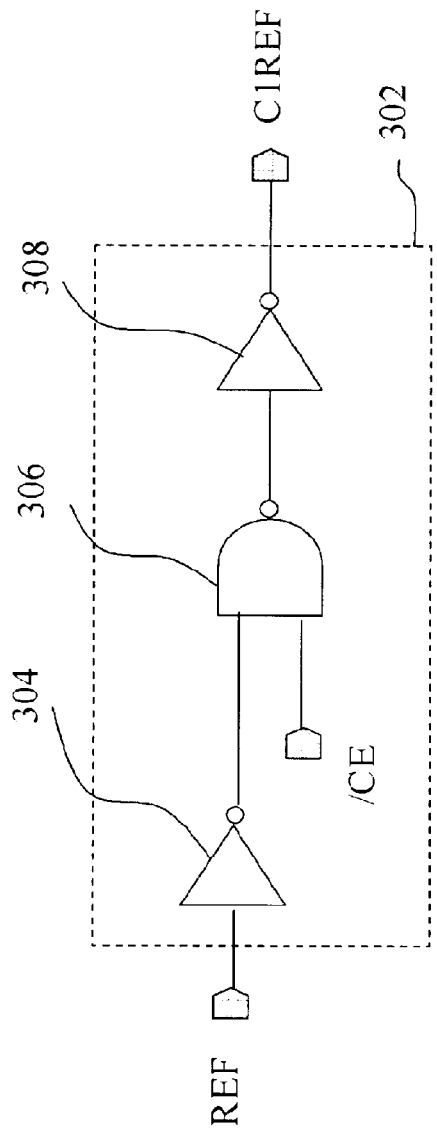
FIGS. 3–5 are circuits diagrams schematically illustrating the device for breaking leakage current path according to various embodiments of the present invention.
Figure 4:
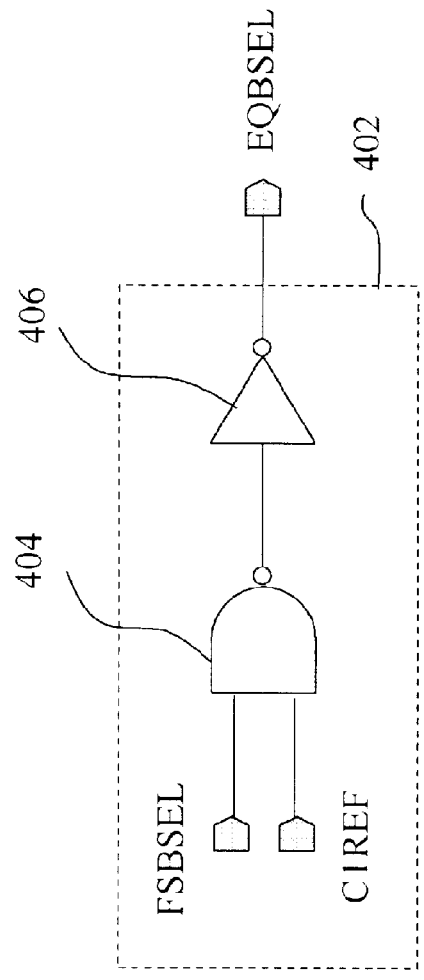
Figure 5:
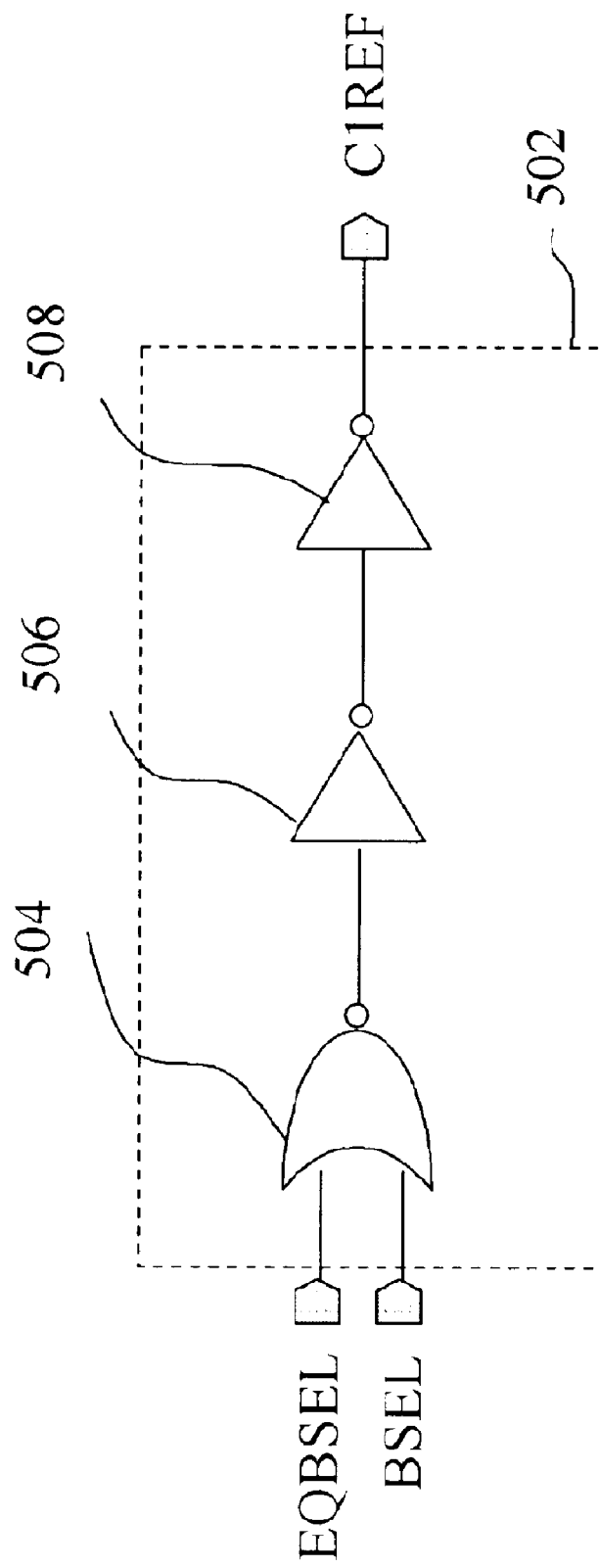

FIG. 2 is a schematic drawing illustrating another conventional memory cell of DRAM. FIGS. 3–5 are circuits diagrams schematically illustrating the device for breaking leakage current path according to various embodiments of the present invention. The circuits shown in FIGS. 3–5 are connected to the memory cell 102 shown in FIG. 2. Hereinafter, the operation of a normal good die of a DRAM cell of the invention without cross failure will be described.

Referring to the memory cell 102 shown in FIG. 2, the signals that may affect the leakage current include, for example but not limited to, EQLt, EQLb, MUXt, MUXb, etc., wherein the signal EQLt and MUXt are directly related to the memory cell 102. Following are the descriptions showing how to control these signals to break the leakage current path.

Figure 6:
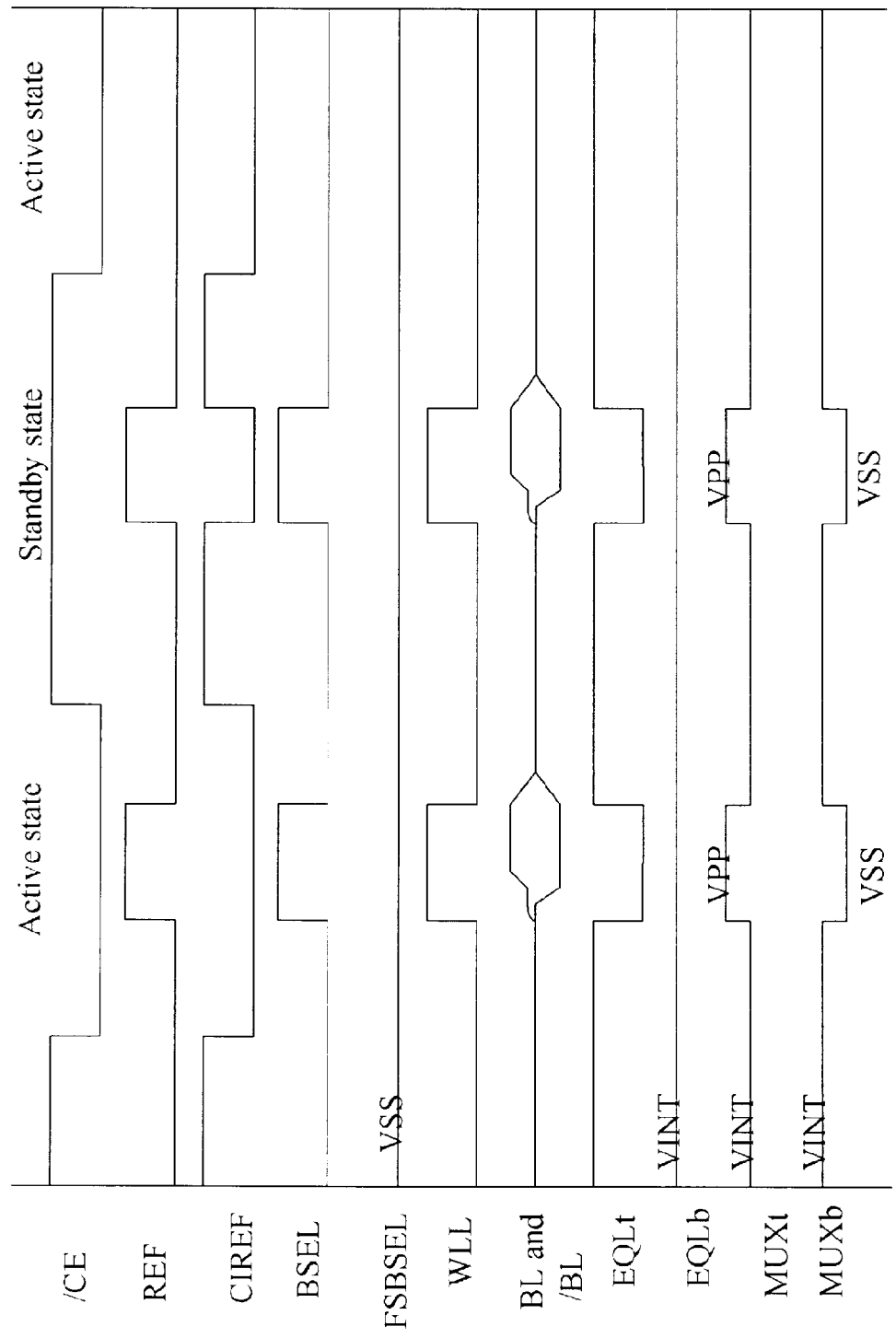
FIG. 6 is a waveform diagram schematically illustrating the waveform of the memory cell during a normal operation according to the various embodiments of the present invention.

FIG. 6 is a waveform diagram schematically illustrating the waveform of the memory cell during a normal operation according to various embodiments of the present invention, wherein the memory cell is a normal good die. Referring to FIG. 6, when the signal /CE is, for example, in low state, the memory cell 102 is active. Alternatively, when the signal /CE is in high state, the memory cell 102 is in standby state. The signal REF is a reference signal corresponding to the state of the word line WLL.

Referring to FIG. 3, the circuit block 302 includes, for example but not limited to, an inverter 304, a NAND gate 306 and an inverter 308. It is noted that the reference signal REF is inverted by the inverter 304, and is then processed with signal /CE by the NAND gate 306 and the inverter 308. Finally, the signal C1REF shown in FIG. 6 is obtained. The difference between the signal C1REF and signal /CE is that when signal /CE and signal REF are in high state, signal C1REF is in low state.

Referring FIG. 4, the circuit block 402 includes a NAND gate 404 and an inverter 406. It is noted that when the memory cell 102 is a normal good die, the signal FSBSEL shown in FIG. 6 is in low state. Alternatively, when the memory cell 102 is shorted due to, for example, a cross failure, the signal FSBSEL is in high state,. The signal FSBSEL and the signal C1REF are processed by the NAND gate 306 and the inverter 308, and thus the signal EQBSEL is generated. It is noted that, when the memory cell 102 is a normal good die, the signal FSBSEL is in low state, thus, the signal EQBSEL is always in low state regardless of whether the signal /CE is in high or low state.

Referring to FIG. 5, the circuit block 502 includes a NOR gate 504 and two inverters 506 and 508. The signal BSEL shown in FIG. 6 and the signal EQBSEL described above are processed by the NOR gate 504 and the inverters 506 and 508, and thus the signal EQL is generated. In FIG. 2, for the memory cell 102, the signal EQL is equivalent to the signal EQLt. When the memory cell 102 is a normal good die, since the signal EQBSEL is always in low state regardless of whether the signal /CE is in high or low state, the signal EQLt is always an inverse signal to that of the signal BSEL. Moreover, since the signal EQLb is in high state, the bit line BL is a half bit-line high voltage (VBLEQ).

Accordingly, in the embodiment of the present invention, when the device and method for breaking leakage current path are provided, the operation of the memory cell 102 is similar to a conventional memory cell when the memory cell 102 is a normal good die.

Hereinafter, when the memory cell 102 shown in FIG. 2 is shorted due to, for example, a cross failure, the operation of the memory cell, will be described.

Figure 7:
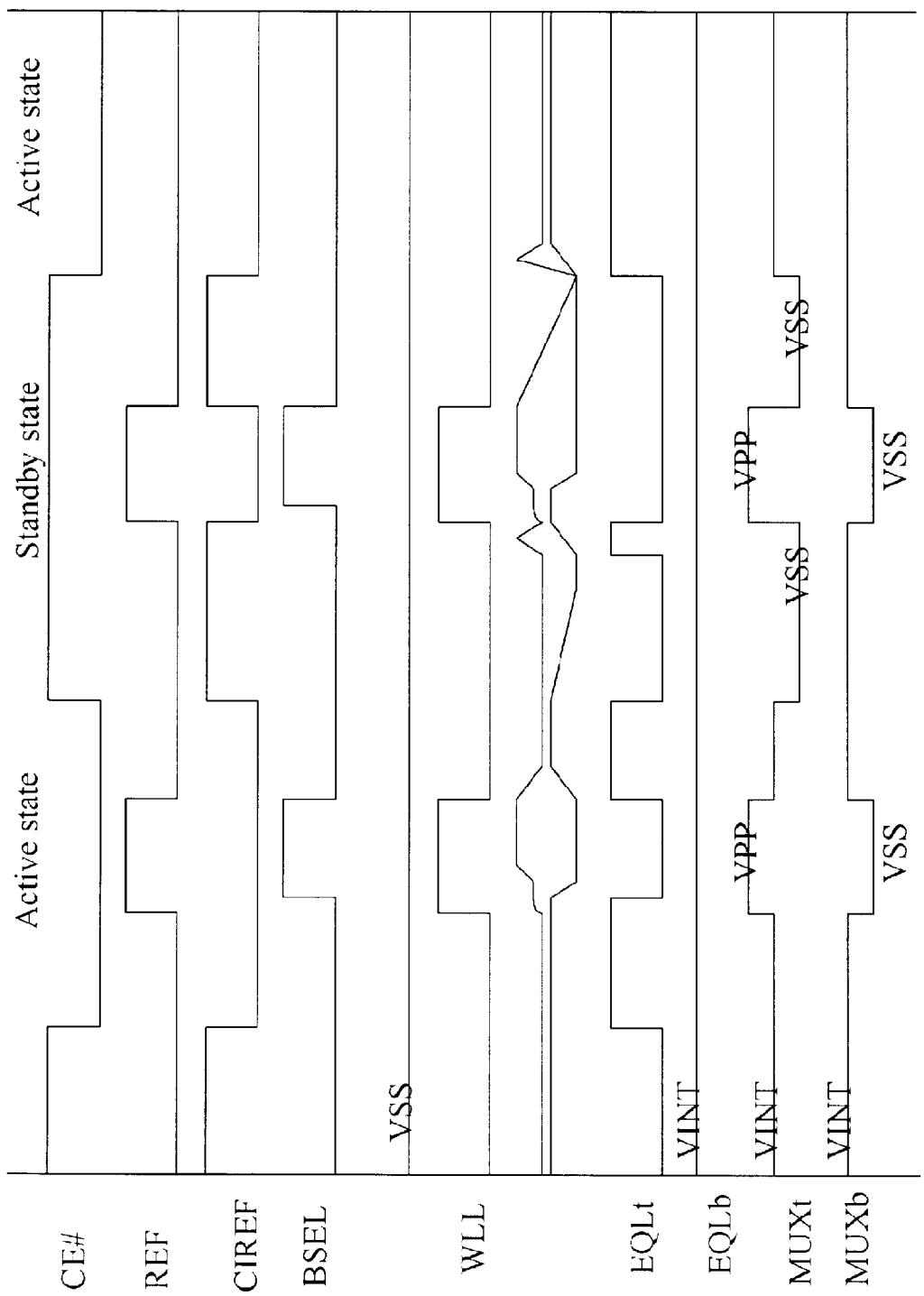
FIG. 7 is a waveform diagram schematically illustrating the waveform of the memory cell with cross failure according to the various embodiments of the present invention.

FIG. 7 is a waveform diagram schematically illustrating the waveform of the memory cell with cross failure according to the embodiments of the present invention. It is noted that, the signal /CE is in low state when the memory cell 102 is active and the signal /CE is in high state when the memory cell 102 is in standby state regardless of whether the memory cell 102 is a normal good die or shorted. The signal REF is a reference signal corresponding to the state of the word line WLL.

Referring to FIG. 3, the reference signal REF is inverted by the inverter 304 and processed with signal /CE by the NAND gate 306 and the inverter 308, and thus the signal C1REF shown in FIG. 7 is generated. Similarly, the difference between the signal C1REF and the signal /CE is that when the signal /CE and the signal REF are in high state, the signal C1REF is in low state.

Referring to FIG. 4, when the memory cell 102 is short, the signal FSBSEL shown in FIG. 7 is in high state. The signal FSBSEL and the signal C1REF are processed by the NAND gate 306 and the inverter 308, and thus the signal EQBSEL is generated. When the memory cell 102 is shorted and the signal FSBSEL is in high state, the signal EQBSEL is in the same state with the signal C1REF. Therefore, when the signal C1REF is in high state, the signal EQBSEL is in high state, on the other hand, when C1REF signal is in low state, the signal EQBSEL is in low state.

Referring to FIG. 5, the signal BSEL shown in FIG. 6 and the signal EQBSEL described above are processed by the NOR gate 504, the inverter 506 and the inverter 508, and then the signal EQL is generated. In FIG. 2, for the memory cell 102, the signal EQL is equivalent to the signal EQLt. When the memory cell 102 is short, the signal EQBSEL is in the same state as the signal C1REF, the signal BSEL is similar to the reference signal REF. However, referring to FIG. 7, the rising time from low to state to high state of the signal BSEL is later than that of the reference signal REF regardless of whether the memory cell 102 is active state or standby state. Therefore, when the memory cell 102 is shorted, the difference between the signal EQLt shown in FIG. 6 and the signal EQLt shown in FIG. 7 is that the EQLt signal of FIG. 7 corresponds to the signal C1REF (i.e., the signal /CE). Therefore, when the memory cell 102 is active (i.e., the signal /CE is in low state), the signal EQLt is in high state. It is to be noted that a portion of signal EQLt is in low state since a restorage of charge for the capacitor of the memory cell 102 is required. When the signal EQLt is in low state, a restoring operation of charge is performed by the bit lines BL and /BL. When the memory cell 102 is in standby state (i.e., the signal /CE is in high state), the signal EQLt is in low state, wherein a portion of signal EQLt is in high state since a pre-charging for the capacitor of the memory cell 102 is required. When the signal EQLt is in low state, a restoring operation of charge is performed by the bit lines BL and /BL. Moreover, the signal EQLb is at VINT regardless of whether the memory cell 102 is in active state or stand by state.

Referring to FIG. 6, when the memory cell 102 is a normal good die, the signals MUXt and MUXb are almost at VINT. The state of the signals MUXt and MUXb is changed only when the capacitor of the memory cell 102 is restored. When the state of the signal MUXt is at high state VPP, the signal MUXb is at low state VSS. Referring to FIG. 7, when the memory cell 102 is short, the signal MUXb is almost at VINT. The difference between the signals of MUXb shown in FIGS. 6 and 7 is that the signal MUXb of FIG. 7 is almost at low state VSS when the memory cell 102 is standby. It is to be noted that, similar to FIG. 6, the signals MUXt and MUXb will change only when the capacitor of the memory cell 102 is restored, wherein when the signal MUXt is at high state VPP, the signal MUXb is at low state VSS.

Accordingly, for a conventional memory cell, regardless of whether the memory cell is in active state or standby state, the signals EQLt and MUXt as shown in FIG. 6 are not at low state VSS. However, in the present invention, when the memory cell fails, the signals EQLt and MUXt as shown in FIG. 7 are almost at low state VSS. Therefore, for a failed conventional memory cell without the device for breaking leakage current path of the present invention, the leakage current will incur a large power consumption when the memory cell is standby state. When the device for breaking leakage current path of the present invention is provided, the signals EQLt and MUXt as shown in FIG. 7 are almost at low state VSS and the leakage current is broken.

Figure 8:
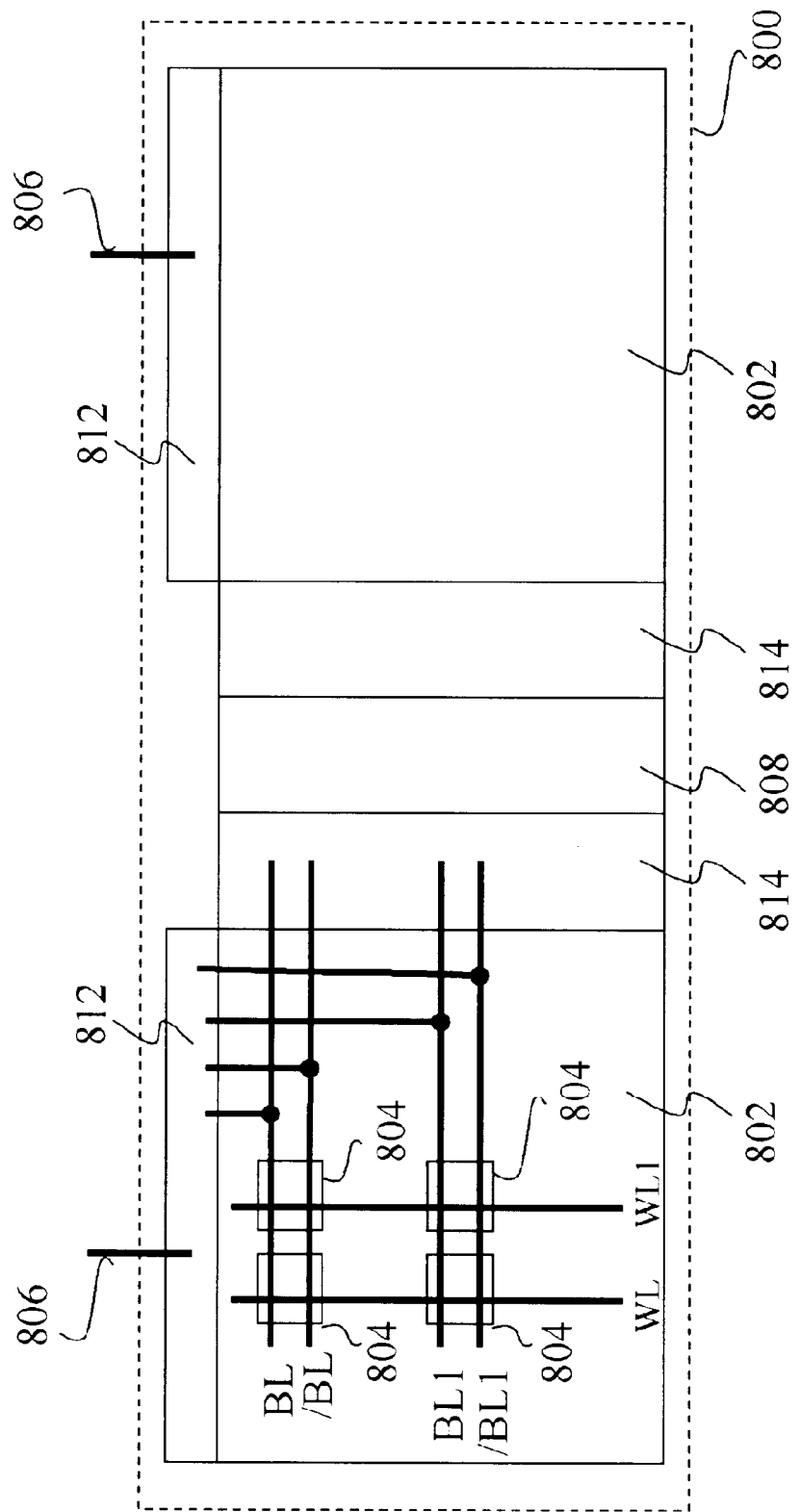
FIG. 8 is a circuits diagram schematically illustrating the device for breaking leakage current path according to an embodiment of the present invention.

FIG. 8 is a circuit diagram schematically illustrating the device for breaking leakage current path according to an embodiment of the present invention. Referring to FIG. 8, a memory 800 is provided by the present invention. The memory device 800 includes, for example but not limited to, a memory array 802, a power supplying terminal 806, a sense amplifier 808, a first breaking circuit 812 and a second breaking circuit 814. The memory array 802 has a plurality of memory cells 804, wherein each of the memory cells 804 has a first bit line BL and a second bit line/BL. The power supplying terminal 806 is used to provide power to the memory cells 804. The first breaking circuit 812 is connected between the first bit line BL of the memory cells 804 and the power supplying terminal 806, and between the second bit line /BL and the power supplying terminal 806. The second breaking circuit 814 is connected between the first bit line BL and the sense amplifier 808, and connected between the second bit line/BL and the sense amplifier 808.

When at least one of the memory cells 804 fails and in standby state, the first breaking circuit 812 disconnects the connection between the first bit line BL and the power supplying terminal 806 and disconnects the connection between the second bit line /BL and the power supplying terminal 806. The second breaking circuit 814 disconnects the connection between the first bit line BL and the sense amplifier 808 and disconnects the connection between the second bit line /BL and the sense amplifier 808.

In the embodiment of the present invention shown in FIG. 2, the first breaking circuit 812 can be connected, for example, between the bit lines BL and /BL and the power supplying terminal VBLEQ. When the memory cell 102 fails and in standby state, the leakage current is cut by the signals EQLt and EQLb. It is preferable that the first breaking circuit 812 includes the circuits shown in FIGS. 3–5.

In the embodiment of the present invention shown in FIG. 2, the second breaking circuit 814 can be connected, for example, between the bit lines BL and /BL and the sense amplifier 106. When the memory cell 102 fails and in standby state, the leakage current is cut by the signals MUXt and MUXb.

In an embodiment of the present invention, the word lines WL of the memory cells 804 can be connected to the first breaking circuit 812 separately. Additionally, the word lines WL of the memory cells 804 can also be connected to the second breaking circuit 814 separately.

In an embodiment of the present invention, the second breaking circuit 814 can be included in the first breaking circuit 812.

In an embodiment of the present invention, the memory array 802, includes, for example but not limited to, a DRAM array.

Accordingly, the first breaking circuit and the second breaking circuit of the present invention can break the leakage current from the power supplying terminal applied to the memory cell when the memory cell fails. Moreover, when the memory array is standby, the current paths from the power source to all the failed memory cells are broken, therefore, the leakage current is substantially reduced and the power consumption is also reduced.

Hereinafter, a method of breaking a leakage current path of the memory cells of a memory device of the present invention is described. The method includes the following steps. When a memory cell of a memory array fails and in standby state, a first step is to provide a first signal for disconnecting the connection between a first bit line and a power supplying terminal and for disconnecting the connection between a second bit line and the power supplying terminal. The second step is to provide a second signal for disconnecting the connection between the first bit line and a sense amplifier and for disconnecting the connection between the second bit line and the sense amplifier.

In the method of breaking leakage current path described above, the first signal can be controlled by a word line of the memory cell. Additionally, the second signal can also be controlled by a word line of the memory cell.

Accordingly, the method for breaking leakage current path of the present invention can break the leakage current from the power supplying terminal to be applied to the memory cell when the memory cell fails. Moreover, when the memory array is in standby state, the current paths from the power source to all the failed memory cells are broken, therefore, the leakage current is substantially reduced and the power consumption is also substantially reduced.

Accordingly, the present invention provides a device and a method for breaking leakage current path for failed memory cells. However, any memory array with defective cells can use the device or method of the present invention to selectively break the leakage current path of the defective memory cells. It is preferable that the timing of breaking the leakage current path can be determined by a standby signal combined with the breaking circuits or signals of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device for breaking leakage current path of a memory cell of a memory device, comprising:
   a memory cell of a memory array, having a first bit line and a second bit line;
   a first breaking circuit, connected between the first bit line of the memory cell and a power supplying terminal and between the second bit line and the power supplying terminal, wherein when the memory cell fails and in standby state, the first bit line and the power supplying terminal are disconnected, and the second bit line and the power supplying terminal are disconnected, by the first breaking circuit connected; and
   a second breaking circuit, connected between the first bit line and a sense amplifier of the memory cell, and between the second bit line and the sense amplifier, wherein when the memory cell fails and in standby state, the first bit line and the sense amplifier are disconnected and the second bit line and the sense amplifier are disconnected by the second breaking circuit.

2. The device of claim 1, wherein a word line of the memory cell is connected to the first breaking circuit.

3. The device of claim 1, wherein a word line of the memory cell is connected to the second breaking circuit.

4. The device of claim 1, wherein the second breaking circuit is comprised in the first breaking circuit.

5. A method of breaking leakage current path of a memory cell of a memory device, comprising:
   providing a first signal for disconnecting a connection between a first bit line and a power supplying terminal and disconnecting a connection between a second bit line and the power supplying terminal when a memory cell of a memory array fails and in standby state; and
   providing a second signal for disconnecting a connection between the first bit line and a sense amplifier and disconnecting a connection between the second bit line and the sense amplifier.

6. The method of claim 5, wherein the first signal is controlled by a word line of the memory cell.

7. The method of claim 5, wherein the second signal is controlled by a word line of the memory cell.

8. A memory device, comprising:
   a memory array, having a plurality of memory cells, wherein each of the memory cells has a first bit line and a second bit line;
   a power supplying terminal, for providing power to the memory cells;
   a sense amplifier;
   a first breaking circuit, connected between the first bit line of the memory cell and the power supplying terminal, and connected between the second bit line and the power supplying terminal, wherein when at least one of the memory cell fails and in standby state, the first bit line and the power supplying terminal are disconnected, and the second bit line and the power supplying terminal are disconnected by the first breaking circuit connected; and
   a second breaking circuit, connected between the first bit line and the sense amplifier of the memory cell, and between the second bit line and the sense amplifier, wherein when at least one of the memory cell fails and in standby state, the first bit line and the sense amplifier are disconnected and the second bit line and the sense amplifier are disconnected by the second breaking circuit.

9. The memory device of claim 8, wherein a plurality of word lines of the memory cells are connected to the first breaking circuit.

10. The memory device of claim 8, wherein a plurality of word lines of the memory cells are connected to the second breaking circuit.

11. The memory device of claim 8, wherein the second breaking circuit is included in the first breaking circuit.

12. The memory device of claim 8, wherein the memory array comprises a DRAM array.

* * * * *